United States Patent
Shibata

(10) Patent No.: US 6,781,247 B2
(45) Date of Patent: Aug. 24, 2004

(54) SEMICONDUCTOR DEVICE

(75) Inventor: Kazutaka Shibata, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 94 days.

(21) Appl. No.: 10/274,952

(22) Filed: Oct. 22, 2002

(65) Prior Publication Data
US 2003/0075791 A1 Apr. 24, 2003

(30) Foreign Application Priority Data
Oct. 23, 2001 (JP) ........................................ 2001-325393

(51) Int. Cl.⁷ .......................... H01L 23/48; H01L 23/52; H01L 29/40
(52) U.S. Cl. .......................... 257/781; 257/780; 257/777
(58) Field of Search ................................. 257/780, 781, 257/777, 779, 778

(56) References Cited

U.S. PATENT DOCUMENTS 5,844,320 A * 12/1998 Ono et al. .................. 257/778
6,137,184 A * 10/2000 Ikegami ...................... 257/785
6,214,642 B1 * 4/2001 Chen et al. .................. 438/108
6,239,983 B1 * 5/2001 Shingai et al. .............. 361/768
6,248,739 B1 * 6/2001 Turner et al. ............. 514/235.2
6,348,739 B1 * 2/2002 Taguchi et al. .............. 257/778
6,583,517 B1 * 6/2003 Jimarez ...................... 257/781
6,617,688 B2 * 9/2003 Ikegami et al. ............. 257/738
6,677,674 B2 * 1/2004 Nagao ........................ 257/724

* cited by examiner

Primary Examiner—S. V. Clark
(74) Attorney, Agent, or Firm—Rabin & Berdo, P.C.

(57) ABSTRACT

This is a COC type semiconductor device in which a second bump of a second semiconductor chip is bonded on a first bump provided on a first semiconductor chip. The bumps of the first and second semiconductor chips are made of a first metal having relatively high melting point such as Au, and the junction portion of the bump is bonded through a second metal layer having lower melting point than that of the first metal. A step lower than the central part is formed at least in a part of the outer periphery at the top surface of the first bump. In this structure, in the semiconductor device of COC type, even if a protective film of polyimide or other resin is formed on the chip surface, a semiconductor device capable of maintaining a high bond strength in the junction portion of the bump is obtained.

6 Claims, 3 Drawing Sheets

SEMICONDUCTOR DEVICE

FIELD OF THE INVENTION

The present invention relates to a semiconductor device of so-called chip-on-chip (COC) type for connecting plural semiconductor chips face to face electrically. More particularly, the present invention relates to a structure of a semiconductor device capable of bonding two mutually confronting semiconductor chips without applying a high temperature or high pressure between the semiconductor chips when connecting together by way of a bump, and preventing creeping of resin up to the bump and lowering of adhesion strength even when forming a protective film of polyimide or other resin on the surface of semiconductor chips for the purpose of cutting off alpha-rays and so on.

BACKGROUND OF THE INVENTION

Hitherto, when a semiconductor device is composed by combination of circuits, such as combination of a memory element and its logic circuit, in order to reduce the area occupied by a solid structure, decrease the parasitic capacity of high frequency circuit, or share part of the circuit (for example, a part of the memory element is shared and the drive circuit portion is changed depending on application), and in a large scale integration in which it is difficult to form in one-chip structure because the severity of manufacturing condition differs in circuit portions, a semiconductor device of COC type is used, in which other semiconductor chip (child chip) is connected on one semiconductor chip (parent chip) by manufacturing a semiconductor circuit composed of a plurality of chips.

In such configuration of semiconductor device, for example, as shown in the bonding process of two semiconductor chips 1 and 2 explained in FIG. 5, one semiconductor chip 1 is fixed on a heated substrate stage 51, other semiconductor chip 2 is fixed on a mount head 52, the mount head 52 is pressed to compress bump electrodes 11 and 21 made of Au or the like of the two chips, and these bump electrodes 11 and 21 are heated to about 450° C. and connected. The material of the bump electrodes 11 and 21 is generally a metal material of a higher melting point such as Au than solder because the semiconductor device is mounted on the substrate by soldering.

In the semiconductor device of such COC type, Au or other high melting point metal material is used as the bump in order to connect plural semiconductor chips beforehand, and therefore favorable electric connection is not obtained unless pressed by heating to about 450° C. When heated to such high temperature when connecting the bump, the semiconductor substrate itself becomes higher than 450° C., and the circuit elements (transistors and other elements composing the semiconductor device) formed on the semiconductor substrate are also heated to a high temperature, and the element characteristics may vary.

Thus, in the semiconductor device of COC type, when connecting the parent chip and child chip through bump, a high temperature of about 450° C. and a pressure must be applied, and element characteristics may vary, and in order to avoid such variation, the present inventor devised, for example, a semiconductor device in a structure of adhering by an Au—Sn alloy layer by forming an Sn coat film on an Au bump, and disclosed it in Japanese Patent Application No. 2001-21113.

On the other hand, for the purpose of cutting off alpha-rays, a protective film may be formed on the semiconductor chip surface by using resin such as polyimide, and when applying the polyimide, as shown in a magnified view of the junction in FIG. 4, a resin 18 may creep up to the bump 11 by surface tension to stick to the surrounding surface of the bump 11, or a thin resin film may be formed on the entire surface of the junction. When such resin 18 sticks to the surface of the bump 11, the contact area of the bump 11 is decreased, or a fillet 3a of an Au—Sn alloy layer 3 may not be formed sufficiently as shown in FIG. 4, and the adhesion strength is weak and the reliability of the junction is lowered. In particular, there is a problem that the reliability of adhesion is lowered significantly, when the resin may creep up to the bump surface by surface tension, and a thin resin film is formed, because hardly any pressure is applied between them when bonding, and adhesion is made by alloying the bump with the low melting point metal.

SUMMARY OF THE INVENTION

The present invention is devised in the light of the above background, and, relating to a semiconductor device of COC type, it is hence an object thereof to obtain a semiconductor device being free from effects of the mounting temperature of the semiconductor device, and having a structure capable of maintaining a high bonding strength at an electrode junction even when a protective film of resin such as polyimide is formed on a chip surface, while connecting the electrode terminals of semiconductor chips without deteriorating the characteristics of semiconductor chips by the temperature applied at the time of bonding.

The semiconductor device of the present invention is a semiconductor device includes; a first semiconductor chip, a second semiconductor chip, and a bump provided on at least one of the first semiconductor chip and second semiconductor chip, the bump being disposed at a junction portion of the first semiconductor chip and second semiconductor chip, wherein the bump is made of a first metal, a top surface of the bump is bonded through a second metal having a lower melting point than that of the first metal, and a step lower than a central portion is formed at least in part of an outer periphery on the top surface of the bump.

Herein, the semiconductor chip is not limited to an integrated circuit (IC), but includes discrete components such as transistor, diode and capacitor. The second metal is not a single metal alone, but includes a eutectic alloy, which is meant to include an alloy formed between the first metal and a third metal in the bonding process by disposing the third metal on the first metal surface.

In such configuration, even in the case of forming a protective film of polyimide or other resin on the surface of a semiconductor chip for the purpose of cutting off alpha-rays, when the resin is applied by spin coating or the like and creeps up to the bump by surface tension, it is stopped at the step portion of the bump, and the resin does not creep up to the top surface, that is, the adhesion surface of the bump. As a result, it avoids conventional problems, such as narrowing of adhesion surface of the bump, lowering of adhesion strength due to a thin resin film formed on the bump surface, or increase of contact resistance.

More specifically, the first semiconductor chip has a first bump, the second semiconductor chip has a second bump of which peripheral length is shorter than that of the first bump, the step is formed around the first bump, and the first bump and second bump are bonded through the second metal layer so that a fillet may be formed, and therefore even if a protective film of polyimide or the like is formed on the first semiconductor chip surface for the purpose of cutting off alpha-rays, the resin film does not creep up to the fillet forming surface, and a fillet can be formed in a wide area, so that a very stable bonding is obtained.

When the first metal is Au and the second metal is an Au—Sn alloy, it is possible to be adhered at a relatively low temperature without applying pressure, and the melting temperature may be higher than the soldering temperature to the mounting substrate, and therefore the junction portion is not detached at the time of mounting, and a very stable bonding is obtained. Moreover, when a protective film formed by curing a liquid resin is disposed at least around the bump of the semiconductor chip having the bump in which the step is formed, the resin is prevented from creeping up to the junction surface of the bump, and the effect is outstanding in particular.

DETAILED DESCRIPTION OF THE INVENTION

Figure 1A:
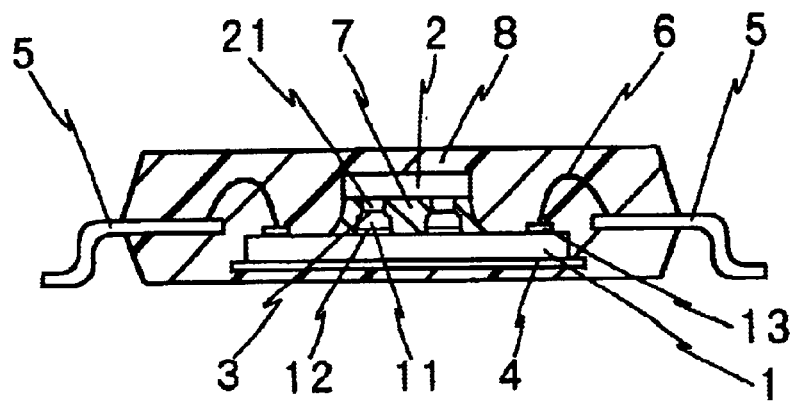
FIG. 1 is a sectional explanatory view showing an example of a semiconductor device on the present invention and an explanatory view of a side surface for connecting chips.
Figure 1B:
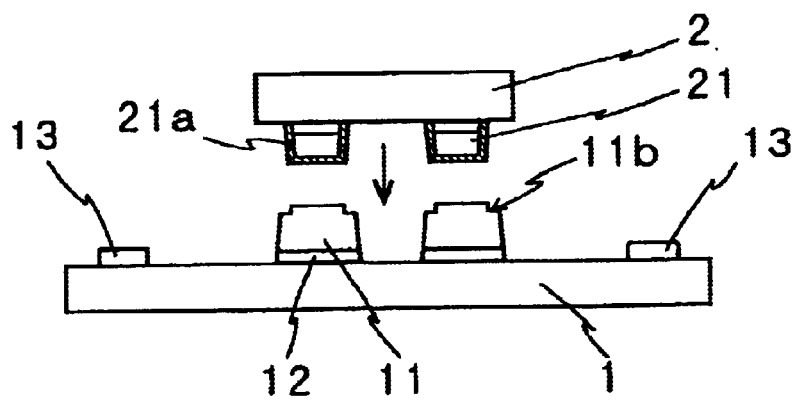

Referring now to the drawings, a semiconductor device of the present invention is described. The semiconductor device of the present invention is shown in FIG. 1A and FIG. 1B, respectively showing a sectional structure of an embodiment and a partially magnified view of the state before bonding of two semiconductor chips, and this is a COC type having a second bump 21 of a second semiconductor chip 2 bonded on a first semiconductor chip 1 having a first bump 11 formed on the surface. The bumps 11, 21 of the first and second semiconductor chips 1, 2 are made of a first metal of relatively high melting point such as Au, and the junction of the bumps 11, 12 is bonded through a second metal layer of which melting point is lower than that of the first metal. It is a feature of the present invention that a step 11b lower than the central side is formed at least in part of the outer periphery at the top surface of the first bump 11.

In the example shown in FIG. 1, in both the first semiconductor chip 1 and second semiconductor chip 2, the first and second bumps 11, 21 are formed in a thickness of about 10 to 30 μm by plating or other process, and further a layer of Sn is formed on the surface of the second bump 21 of the second semiconductor chip 2 in a thickness of about 0.5 to 3 μm by electroless plating or sputtering. That is, an alloy layer (second metal: Au—Sn) of first metal (Au) and third metal (Sn) is formed, and the third metal is made of a material which is melted at lower temperature than the melting point of the first metal and is alloyed with the first metal. In the example shown in FIG. 1, the first bump 11 has a large diameter, about 70 μm, and a step 11b of about several μm in width and about several μm in height is formed around the periphery of its top surface, and the second bump 21 has a smaller diameter than the first bump 11, about 50 μm, and the Sn film 21a is disposed nearly on the entire surface.

This step 11b may not be formed on the entire periphery of the bump 11, but if divided, as far as it is formed in a total length of about ⅓ of the overall peripheral length, creeping to higher positions can be prevented. This step can be formed, for example, by removing part of the periphery by etching with a mask after forming the bump by plating. Or after plating nearly to the thickness of the bump 11, by forming a mask partially and continuously plating, the step 11b can be formed.

Figure 2:
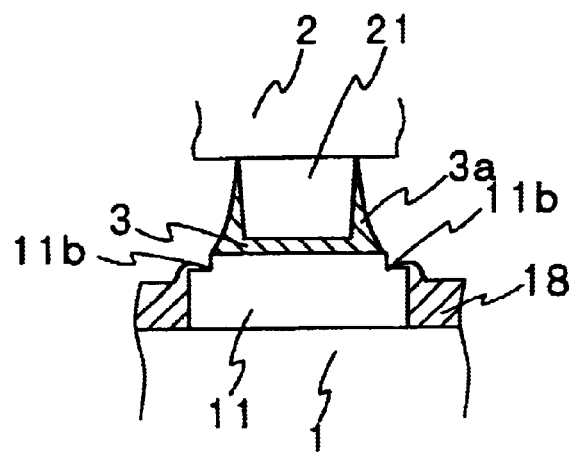
FIG. 2 is a magnified sectional explanatory view of a junction portion of bump in FIG. 1.

The step 11b formed at the end portion of the bump 11 is intended to prevent the resin from creeping up to the adhesion surface (top surface) of the bump 1 when applying the resin, in the case of forming a protective film of polyimide resin or the like in order to protect the circuit formed inside from irradiation of alpha-rays or the like. That is, as shown in a magnified view of the junction portion in FIG. 2, by forming the step 11b, if the resin 18 creeps up, the resin 18 is stopped at the step 11b, and the polyimide resin cannot creep up to the adhesion area of the bumps 11, 21, so that the strength of adhesion may be enhanced.

Figure 1C:
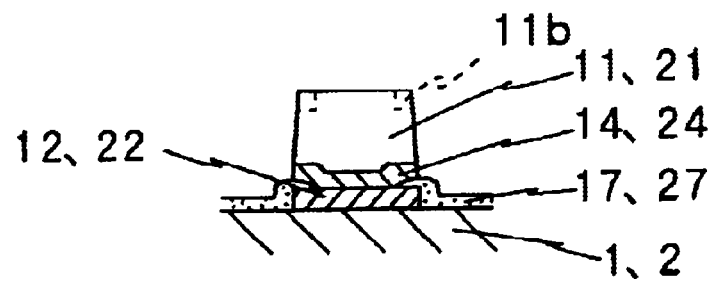

The bumps 11, 21 are formed same as in the prior art, and as shown in a magnified sectional view of the bump portion in FIG. 1C, for example, two or three layers of barrier metal layers 14, 24 are formed on electrode terminals 12, 22 made of Al, and Ti or Cr is used in the first layer of the barrier metal layers 14, 24, W, Pt, Ag, Cu, Ni, or the like in the second layer, and Au or the like in the third layer. The bumps 11, 21 are formed thereon by using Au or Cu. Reference numerals 17 and 27 are insulating films.

The Sn film (third metal) 21a is disposed on the Au bump 21, and the melting point of Au is about 1064° C. (fused at about 450° C. when heated by pressing mutually to same metal layers) and the melting point of Sn is about 232° C., and it is melted at about 230° C. and forms a eutectic composition with Au and is alloyed, and an alloy layer (second metal) 3 of Au—Sn alloy is formed on the junction surface at about 280° C., so that the both bumps 11, 21 are fused together. That is, at a low temperature not having effects on circuit elements formed on the semiconductor substrate, the both bumps 11, 21 can be fused together. Therefore, the relation between the first metal for composing the bump 21 and the film 21a of the third metal disposed thereon is not particularly specified as far as the melting point of the third metal is lower than the melting point of the first metal, and the first metal is alloyed and fused when the third metal is melted, and the metals are not limited to Au and Sn alone. Alternatively, without using third metal film, a second metal of low melting point such as Au—Sn alloy layer may be directly disposed on the junction surface.

In the first semiconductor chip 1, a drive circuit of memory or the like is formed on a semiconductor substrate, an interlayer insulating film or wiring film is provided on the surface, and finally an electrode terminal 12 for connection with the second semiconductor chip 2 such as memory circuit, and an electrode terminal 13 for connection with an external lead are formed on the surface by using Au or the like. A bump is formed on this electrode terminal 12 by way of a barrier metal layer 14 as mentioned above. The wiring, electrode terminal, and insulating film formed on the surface of this circuit element (semiconductor element) or semiconductor substrate are formed same as in the manufacturing process of an ordinary semiconductor device.

In the second semiconductor chip 2, for example, memory elements are formed in a matrix, portions connected to the drive circuit and portions connected to the external lead are formed on the surface of the semiconductor substrate as an electrode terminal 22, and an Au or other bump 21 is formed on the surface of the electrode terminal 22 same as in the first semiconductor chip 1. On the entire surface of the bump 21, an Sn film 21a is formed. However, the Sn film may be limited only to the junction surface of the second bump 21 or, an Sn film may be formed on the junction surface of the first semiconductor chip 1. That is, the Sn film may be disposed at least in one side.

The second semiconductor chip 2 is not limited to such IC, but may be composed of discrete components such as transistor, diode or capacitor, or not formed on semiconductor substrate. In particular, in the case of a complex semiconductor device for preventing electrostatic breakdown, it is preferred to mount a discrete protective diode or the like as a second semiconductor chip because a protective element of a large capacity can be incorporated.

Figure 3A:
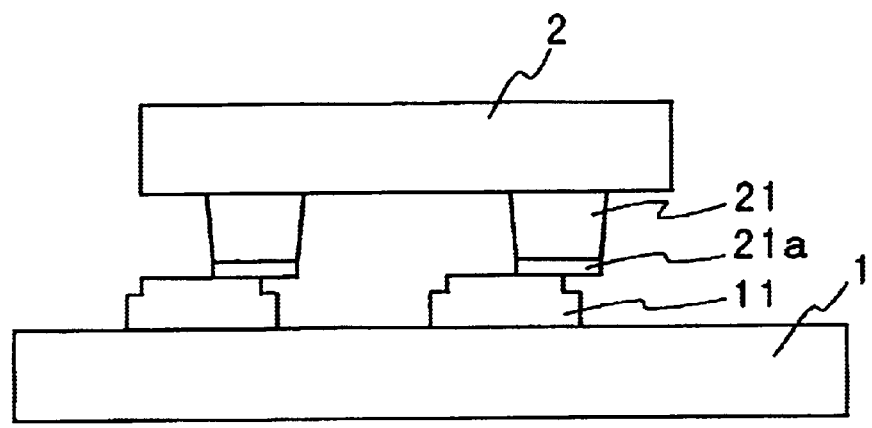
FIG. 3 is a view explaining a method of bonding by self-alignment.
Figure 3B:
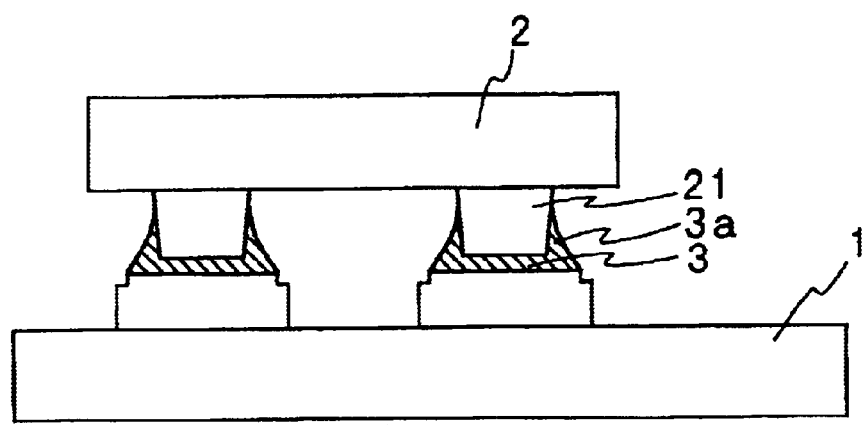
Figure 4:
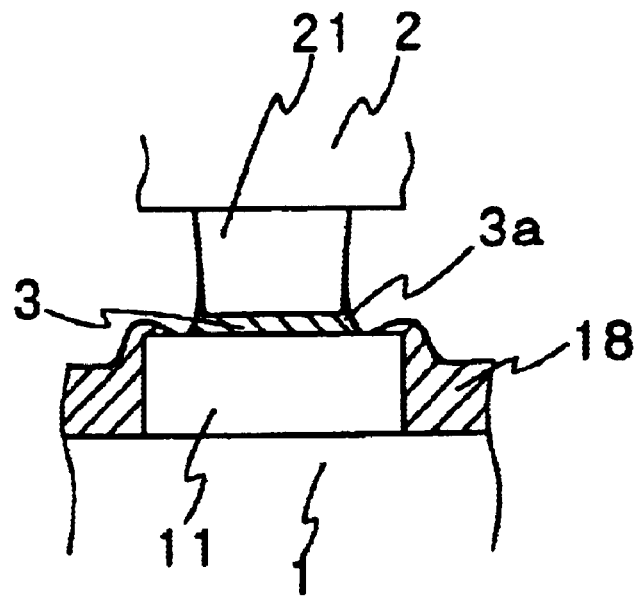
FIG. 4 is a magnified sectional view of a junction portion explaining the problem when a protective film of polyimide or the like is disposed on the surface of a semiconductor chip.
Figure 5:
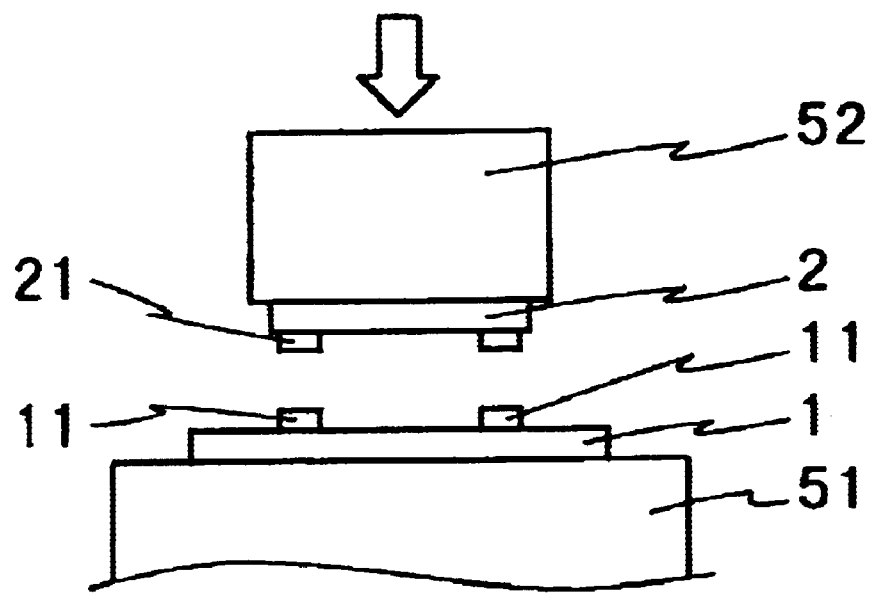
FIG. 5 is a view explaining an example of process of connecting chips in a prior art.

For mutual connection of bumps 11, 21 of the first semiconductor chip 1 and second semiconductor chip 2, for example, the first semiconductor chip 1 is put on a substrate stage capable of heating, and the second semiconductor chip 2 is laid over by a mounter so that the bumps may be roughly matched in position. Then, by heating to about 300° C. while applying a weight similar to the own weight of the second semiconductor chip 2, the Sn film 21a is melted, and a eutectic composition is formed with Au of the bumps 11, 21, thereby forming an alloy layer 3. At this time, as shown in FIG. 3A, if the first semiconductor chip 1 and second semiconductor chip 2 are not positioned completely, the alloy layer 3 is formed at about 300° C., and in a molten state, as shown in FIG. 3B, they are moved to be bonded at their central parts by the surface tension of bumps (self-alignment). By removing the heat, the alloy layer 3 is solidified and adhered.

This self-alignment is not limited to bonding of semiconductor chips alone, but may be similarly applied, for example, to bonding of a substrate and a semiconductor chip, by melting the metal of low melting point such as Au—Sn alloy layer. To apply weight when bonding, only the own weight is applied in the foregoing example, but it may be better to apply heavier weight in the case of bonding many bumps or junctions because the weight applied to each piece is decreased. For example, by applying a load of 2 g per bump, heating of about 350° C. may be applied.

A gap between the first and second semiconductor chips 1, 2 is filled with an insulating resin 7 of epoxy resin or elastomer, and the joined semiconductor chips 1, 2 are bonded on a die island 4 made of lead frame and others same as in manufacture of ordinary semiconductor device, and further bonded with leads 5 through wires 6 such as gold wires, and the surrounding is covered with a resin package 8 formed by molding. The leads are cut off from the lead frame, and formed, so that the semiconductor device as shown in FIG. 1A is manufactured.

According to the semiconductor device of the present invention, since a step is formed in the end portion of the top surface of the first bump 11, if polyimide or other resin is applied on the surface side of the first semiconductor chip 1 and is cured to form a protective film, resin or the like is not adhered to the junction surface of the first bump 11 and second semiconductor chip 2. That is, when a liquid resin is applied, the resin creeps up by surface tension in higher positions such as bumps, but since a step is formed in the first bump, the climbing resin is arrested by the step, and resin film is not formed on the top surface of the adhesion surface. As a result, the junction surface of the bump is not disturbed at all, and there is no adverse effect on the bond strength or contact resistance.

On the other hand, in connection of electrode terminals between the first semiconductor chip and second semiconductor chip, since the first metal composing the bump and the second metal of lower melting point than the first metal are adhered, it is possible to bond at a relatively low temperature of about 300° C. while forming a bump with a metal material of high melting point such as Au. The second metal may be a metal, for example Au—Sn, formed by alloying a material of bump, for example Au, with a metal, for example Su, which has a lower melting point than Au as in the example shown above, and is likely to form a eutectic alloy with Au, or a low melting point metal such as Au—Sn alloy may be formed to be adhered directly.

In the above example, bumps are formed in both first semiconductor chip and second semiconductor chip, but a bump may be formed in one chip alone, and other may be directly bonded to wiring or electrode pad, and an Sn film may be formed on the surface. Further, when bumps are formed in both semiconductor chips, steps may be formed around bumps of both semiconductor chips, or may be formed around bumps of one semiconductor chip alone. That is, they are formed depending on the situation of forming the protective film of polyimide or the like.

The foregoing example is an example of bumps connected to the electrode terminals or wiring, but not limited to electrical connections, if not connected electrically, bumps may be used only for the purpose of connection of the first semiconductor chip and second semiconductor chip.

Moreover, the bump of one semiconductor chip is formed larger than the bump of other semiconductor chip, and a fillet is formed of the second metal, and by such bonding, the adhesion strength is higher and firm connection is realized. However, even if the both bumps are nearly in the same size and fillet is not formed, when the protective film of polyimide or the like is formed on one semiconductor chip surface, a step may be formed in the outer periphery of the bump of the semiconductor chip. Further, in the above example, one second semiconductor chip is bonded on the first semiconductor chip, but the same effects are obtained if a plurality of second semiconductor chips are bonded as child chips.

As explained herein, according to the present invention, even if a protective film is formed on the semiconductor chip surface by applying and curing a liquid resin of polyimide or the like, the resin is not adhered to the adhesion surface of the bump or thin film is not formed on the adhesion surface, and the adhesion strength of the bump is not lowered or the contact resistance is not increased. As a result, a semiconductor device extremely enhanced in the reliability of adhesion is obtained.

Although preferred examples have been described in some detail it is to be understood that certain changes can be made by those skilled in the art without departing from the spirit and scope of the invention as defined by the appended claims.

What is claimed is:

1. A semiconductor device comprising:
   a first semiconductor chip;
   a second semiconductor chip; and
   a bump provided on at least one of said first semiconductor chip and second semiconductor chip, said bump being disposed at a junction portion of said first semiconductor chip and second semiconductor chip, wherein said bump is made of a first metal, a top surface of said bump is bonded through a second metal having a lower melting point than that of said first metal, and a step lower than a central portion is formed at least in part of an outer periphery on said top surface of said bump.

2. The semiconductor device of claim 1, wherein said first semiconductor chip has a first bump, said second semiconductor chip has a second bump shorter in peripheral length than said first bump, said step is formed around said first bump, and said first bump and second bump are bonded through said second metal layer so as to form a fillet.

3. The semiconductor device of claim 1, wherein said bump is disposed on an electrode terminal or wiring, and said first semiconductor chip and second semiconductor chip are connected electrically.

4. The semiconductor device of claim 1, wherein said step of said bump is extended by more than ⅓ of a peripheral length of said top surface of said bump.

5. The semiconductor device of claim 3, wherein said bump is formed on either one of said first semiconductor chip and said second semiconductor chip, and said bump is directly connected to a wiring or an electrode pad of the other of said first and second semiconductor chips.

6. The semiconductor device of claim 1, wherein said first metal is Au and said second metal is an Au—Sn alloy.

* * * * *